(12) United States Patent
Thielmann

(10) Patent No.: US 11,689,001 B2
(45) Date of Patent: Jun. 27, 2023

(54) SWITCH CABINET ARRANGEMENT WITH A SWITCH CABINET AND AT LEAST ONE POWER STRIP

(71) Applicant: RITTAL GMBH & CO. KG, Herborn (DE)

(72) Inventor: Bodo Thielmann, Siegbach (DE)

(73) Assignee: RITTAL GMBH & CO. KG, Herborn (DE)

( * ) Notice: Subject to any disclaimer, the term of this patent is extended or adjusted under 35 U.S.C. 154(b) by 120 days.

(21) Appl. No.: 17/426,690

(22) PCT Filed: Feb. 13, 2020

(86) PCT No.: PCT/DE2020/100097
§ 371 (c)(1),
(2) Date: Jul. 29, 2021

(87) PCT Pub. No.: WO2020/173522
PCT Pub. Date: Sep. 3, 2020

(65) Prior Publication Data
US 2022/0109288 A1  Apr. 7, 2022

(30) Foreign Application Priority Data
Feb. 25, 2019  (DE) .................... 10 2019 104 723.4

(51) Int. Cl.
*H05K 7/14* (2006.01)
*H02B 1/32* (2006.01)
*H02B 1/30* (2006.01)

(52) U.S. Cl.
CPC ............... *H02B 1/32* (2013.01); *H02B 1/301* (2013.01); *H05K 7/1492* (2013.01)

(58) Field of Classification Search
CPC .......... H02B 1/301; H02B 1/306; H02B 1/32; H05K 7/149
See application file for complete search history.

(56) References Cited

U.S. PATENT DOCUMENTS 7,196,900 B2 * 3/2007 Ewing .................. H05K 7/1492
174/59
7,312,980 B2 * 12/2007 Ewing .................. H05K 7/1492
307/41
(Continued)

FOREIGN PATENT DOCUMENTS

DE    10-2005-051941 A1    5/2007
DE    102014100417-63      4/2015
(Continued)

OTHER PUBLICATIONS

International Search Report (in English and German) and Written Opinion of the ISA (in German) issued in PCT/DE2020/100097, dated Apr. 24, 2020; ISA/EP.
(Continued)

*Primary Examiner* — Robert J Hoffberg
(74) *Attorney, Agent, or Firm* — Harness, Dickey & Pierce, P.L.C.

(57) ABSTRACT

The invention relates to a switch cabinet arrangement having at least one switch cabinet and at least one power strip, the power strip being fixed to a vertical profile inside the switch cabinet via an adapter, wherein the adapter is a hook-in adapter which has a first adapter part on the vertical profile and a second adapter part on the power strip, the power strip being hooked into the first adapter part on the vertical profile via the second adapter part.

19 Claims, 8 Drawing Sheets

(56) References Cited

U.S. PATENT DOCUMENTS

Figure 1:
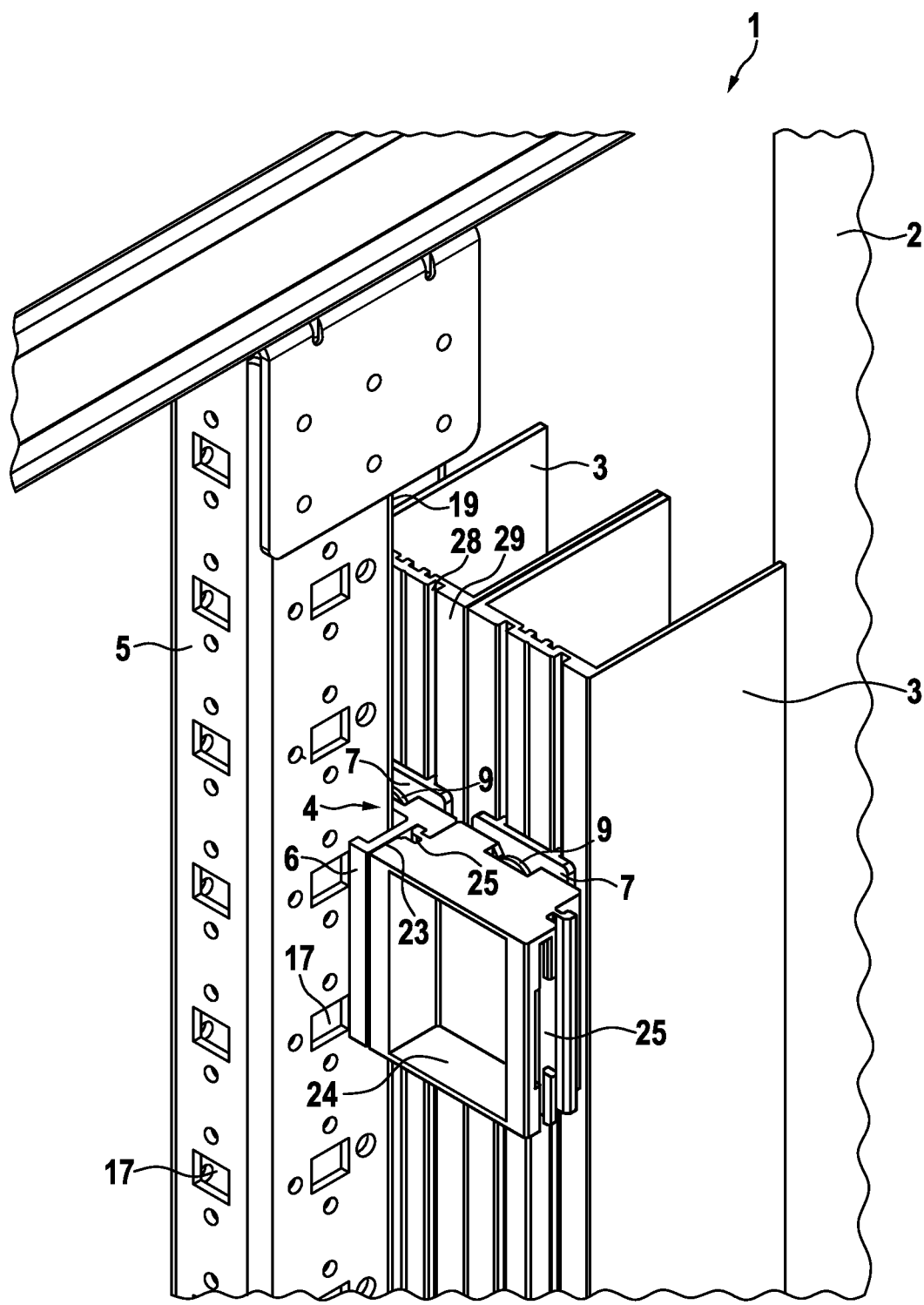

| | | | | |
|---|---|---|---|---|
| 7,324,006 | B2* | 1/2008 | Godard | H01R 25/00 |
| | | | | 361/64 |
| 7,360,659 | B1* | 4/2008 | Yoon | H02B 1/306 |
| | | | | 292/60 |
| 7,535,696 | B2* | 5/2009 | Ewing | H05K 7/1492 |
| | | | | 307/41 |
| 9,496,689 | B2* | 11/2016 | Boehme | H02B 1/01 |
| 10,030,689 | B2 | 7/2018 | Thielmann et al. | |
| 11,234,513 | B2* | 2/2022 | Tsai | H05K 5/0221 |
| 2005/0101193 | A1 | 5/2005 | Godard | |
| 2007/0257169 | A1* | 11/2007 | Taggett | A47B 96/068 |
| | | | | 248/220.41 |
| 2008/0258026 | A1* | 10/2008 | Smith | H02G 3/126 |
| | | | | 248/218.4 |
| 2014/0070679 | A1* | 3/2014 | Liang | H05K 7/1492 |
| | | | | 312/223.1 |
| 2014/0160637 | A1* | 6/2014 | Liu | H05K 7/1492 |
| | | | | 361/622 |
| 2017/0070679 | A1 | 3/2017 | Chung et al. | |

FOREIGN PATENT DOCUMENTS

| | | |
|---|---|---|
| DE | 102004007260-64 | 5/2016 |
| EP | 2608645 A1 | 6/2013 |
| TW | 201206306 A * | 2/2012 |

OTHER PUBLICATIONS

German International Preliminary Report on Patentability issued in PCT/DE2020/100097, dated Feb. 8, 2021; ISA/EP.

* cited by examiner

SWITCH CABINET ARRANGEMENT WITH A SWITCH CABINET AND AT LEAST ONE POWER STRIP

CROSS-REFERENCE TO RELATED APPLICATIONS

This application is a 371 U.S. National Phase of International Application No. PCT/DE2020/100097, filed on Feb. 13, 2020, which claims the benefit of German Application No. 10 2019 104 723.4, filed on Feb. 25, 2019. The entire disclosures of the above applications are incorporated herein by reference.

BACKGROUND

This section provides background information related to the present disclosure which is not necessarily prior art.

TECHNICAL FIELD

The invention is based on a switch cabinet arrangement with at least one switch cabinet and at least one power strip, wherein the power strip is fixed to a vertical profile inside the switch cabinet via an adapter. Such a switch cabinet arrangement is known from DE 10 2014 100 417 B3. DE 10 2004 007 260 B4 describes a similar switch cabinet arrangement.

DISCUSSION

The switch cabinet arrangements known from the prior art have the disadvantage that the adapters are individually adapted for the respective intended position within the switch cabinet at which the power strip is to be mounted in the switch cabinet, so that in the application the appropriate adapter must always be provided in order to mount the power strip at a desired position in the switch cabinet.

SUMMARY

This section provides a general summary of the disclosure, and is not a comprehensive disclosure of its full scope or all of its features.

It is therefore one aspect of the invention to further develop a switch cabinet arrangement of the type described above in such a way that the adapter is prepared for flexible mounting of the power strip inside the switch cabinet.

Accordingly, it is provided that the adapter is a hook-in adapter which has a first adapter part on the vertical profile and a second adapter profile on the power strip, the power strip being hooked into the first adapter part on the vertical profile via the second adapter part. For example, an embodiment is conceivable in which the second adapter part mounted on the power strip is an adapter part which is prepared with various embodiments of first adapter parts for the suspended mounting of the power strip on the respective first adapter part. With the aid of the uniform second adapter part, the power strip can thus be mounted at any point in the switch cabinet at which a respective first adapter part is provided, by hooking it into the second adapter part.

The second adapter part can be fixed to the power strip via a detachable connection, preferably via a screw connection. The second adapter part can further have a tongue-and-groove connection via which it is pre-positioned on the power strip. In this case, the screw connection is provided to create a non-positive connection between the second adapter part and the power strip.

The first adapter part can have a plug receptacle, for example a snap-in receptacle or a keyhole, and the second adapter part can have a mushroom head which is hooked into the plug receptacle. The second adapter part may have an abutment side facing away from the power strip, via which the second adapter part abuts the first adapter part or the vertical profile. The mushroom head can have a shaft with which it projects from the contact side of the second adapter part. The shaft can be locked in the plug-in receptacle by means of a snap-in connection. For this purpose, the shaft may, for example, have a non-circular contour on its outer circumference which is complementary to a contour in the plug-in receptacle, whereby locking of the shaft in the plug-in receptacle is achieved via the interlocking contours.

The second adapter part may be attached to a rear side of the power strip via a screw bolt. The screw bolt may extend from the mushroom head, through the mushroom head and the shaft, and into the rear of the power strip.

The vertical profile can be a profile rail, for example a 19″ profile rail, which is fixed within the switch cabinet via its opposite longitudinal ends. In this case, the first adapter part may be a keyhole of a plurality of keyholes formed in a regularly spaced manner in a mounting side of the profile rail. For example, the profile rail may be a 19″ profile rail of an IT cabinet.

The first adapter part can have at least one shaped and/or latching piece on a fastening side for mounting the first adapter part on the vertical profile, via which the first adapter part is positively and/or non-positively fixed in a system perforation of the vertical profile.

The shaped and/or latching piece can have a shaped piece which rests in a form-fitting manner on a contour of a vertical profile of a framework or on a contour of a profile rail, the shaped piece having at least one latching projection via which the shaped and/or latching piece engages in the system perforation of the vertical profile or of the profile rail and engages behind the latter.

The first adapter part can have a plug-in receptacle for the second adapter part opposite the shaped and/or latching piece.

The first adapter part can have a baying interface on a front side perpendicular to the fastening side. An extension adapter with an interface complementary to the baying interface can be fixed via the baying interface, the extension adapter having a third adapter part via which a further power strip is fixed via a fourth adapter part. The third adapter part can be identical to the first adapter part and the fourth adapter part can be identical to the second adapter part.

The first adapter part and the third adapter part can each have a plug receptacle and preferably the same plug receptacle, whereby the two plug receptacles can be arranged in the same plane.

The second adapter part may be connected to a rear side of the power strip facing the sockets of the power strip via a tongue-and-groove connection extending in the longitudinal direction of the power strip.

The first adapter part may have a plug receptacle, for example a snap-in receptacle, which is open towards an upper side of the first adapter part and towards a front side of the first adapter part facing the second adapter part, and which is undercut only in the direction perpendicular to the front side.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 2:
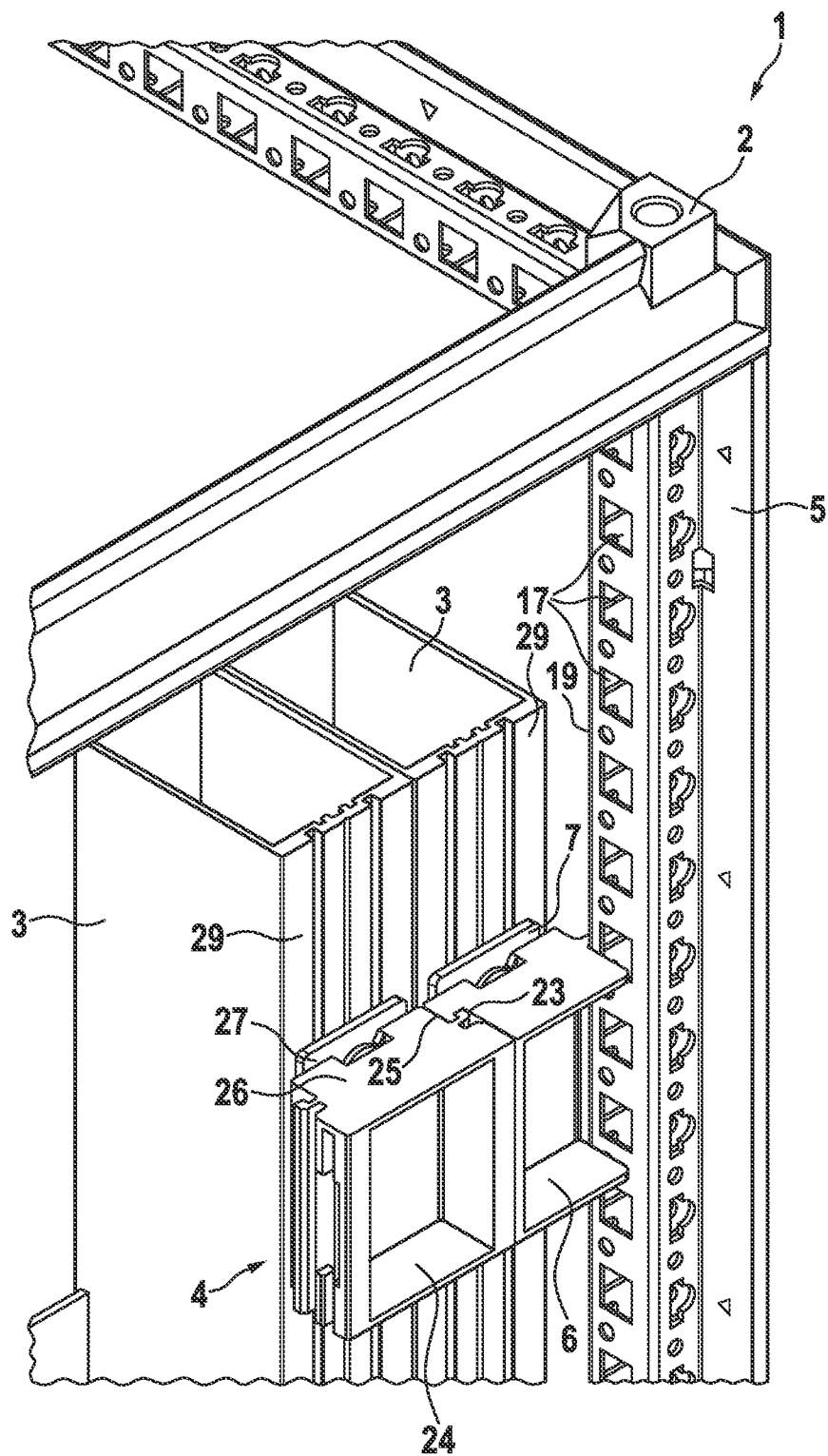
Figure 3:
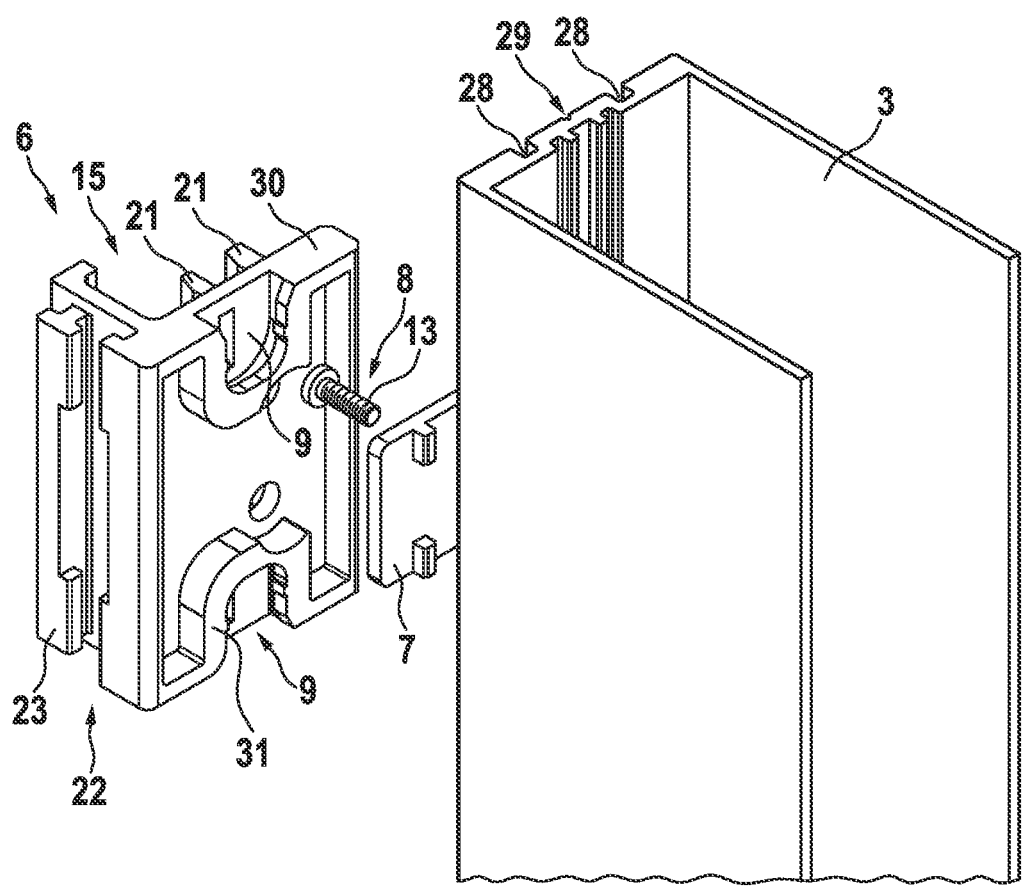
Figure 4:
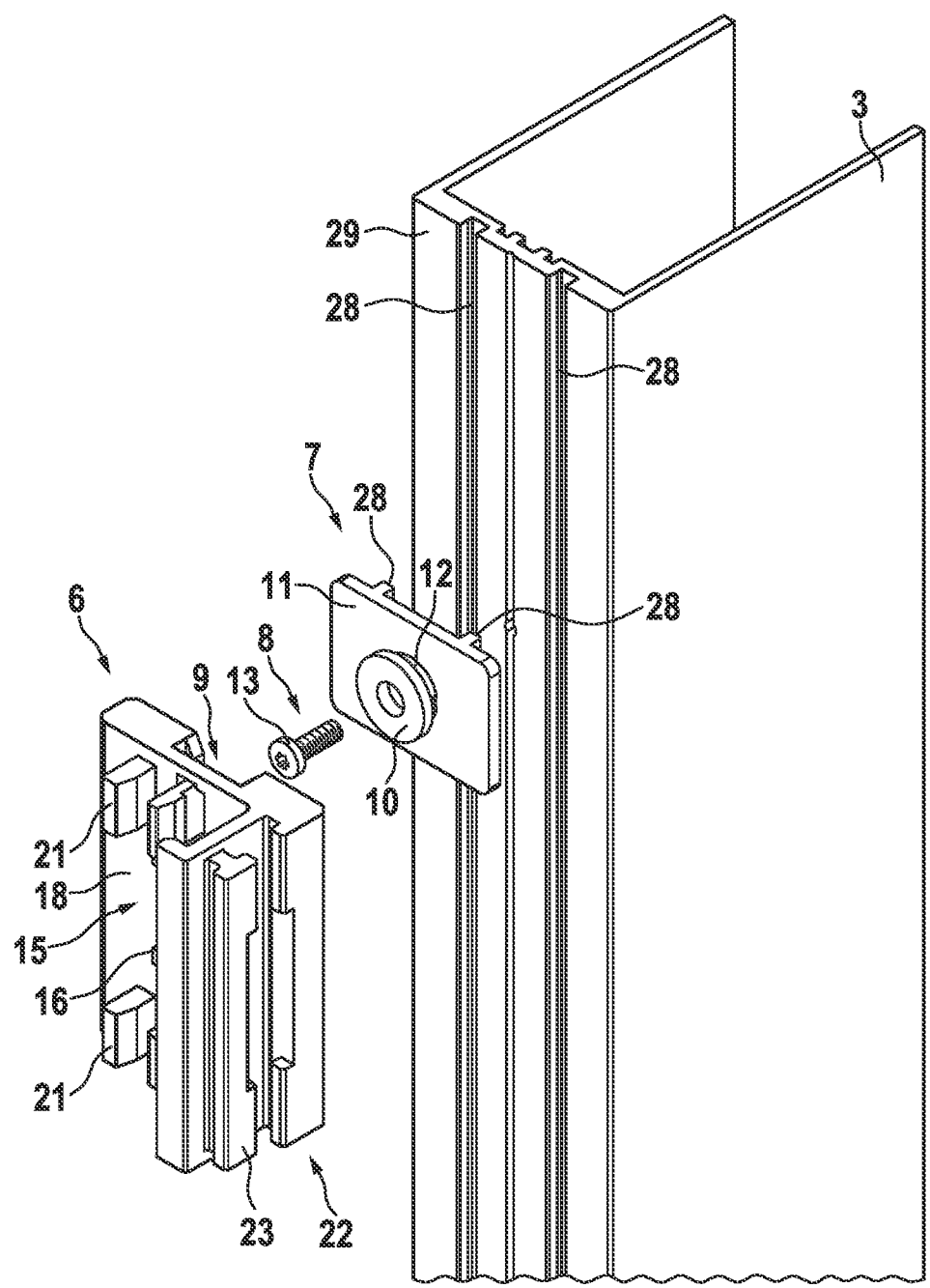
Figure 5:
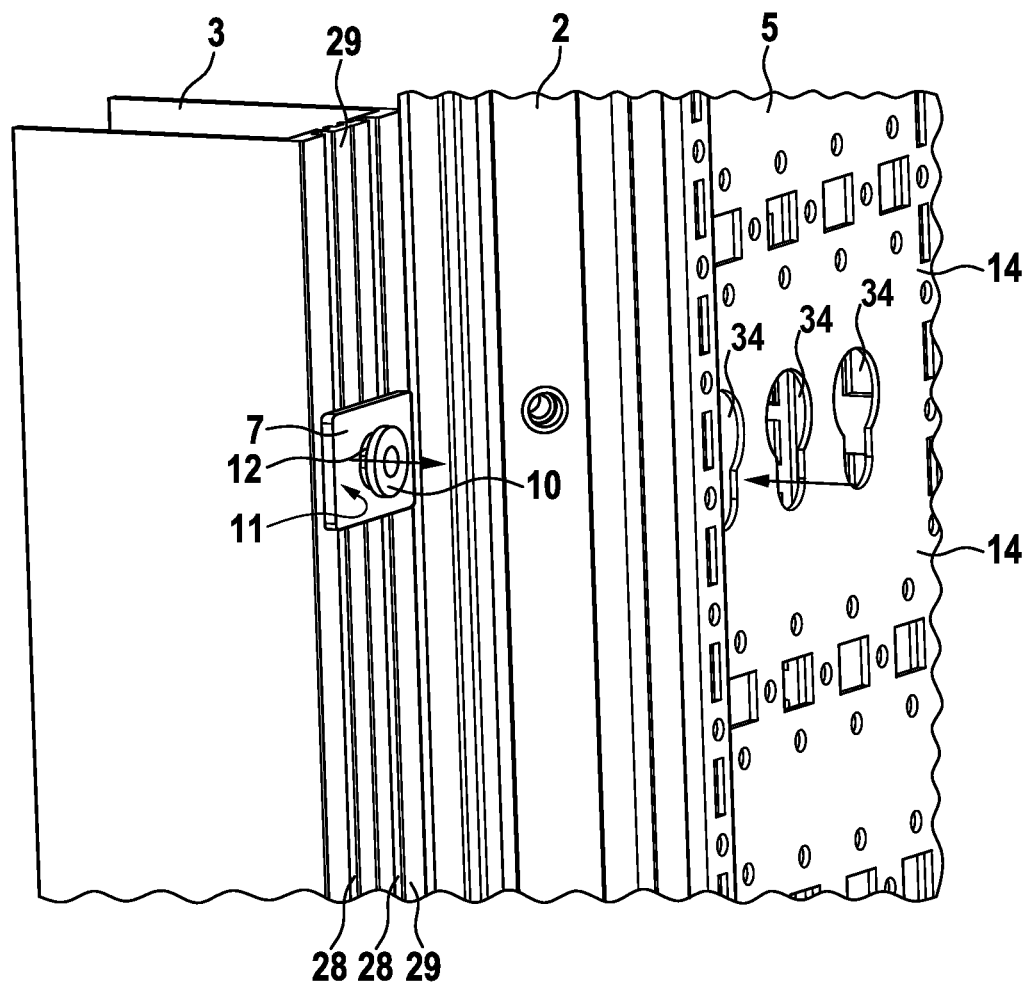
Figure 6:
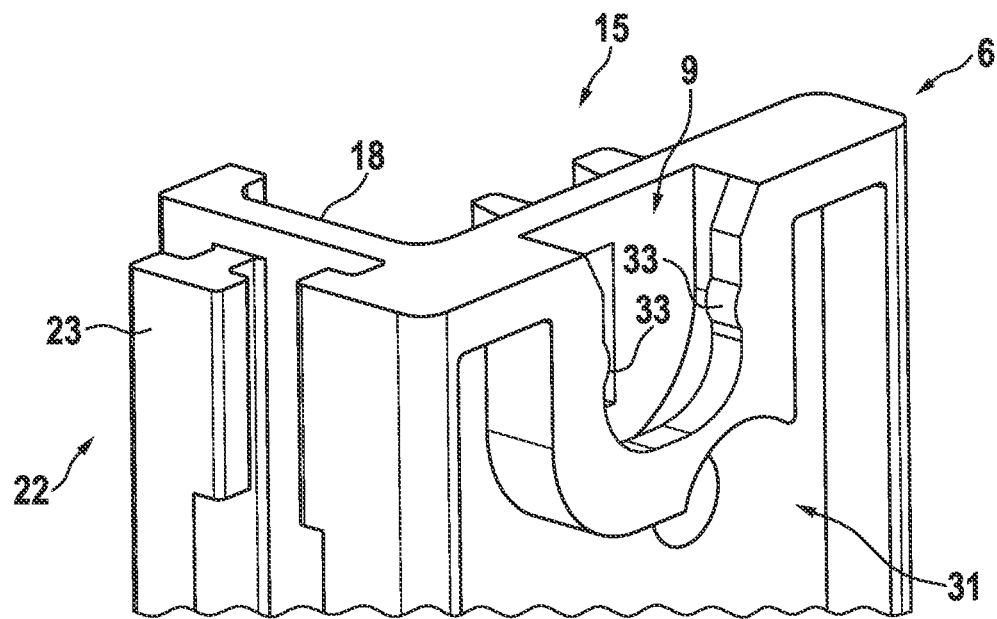
Figure 7:
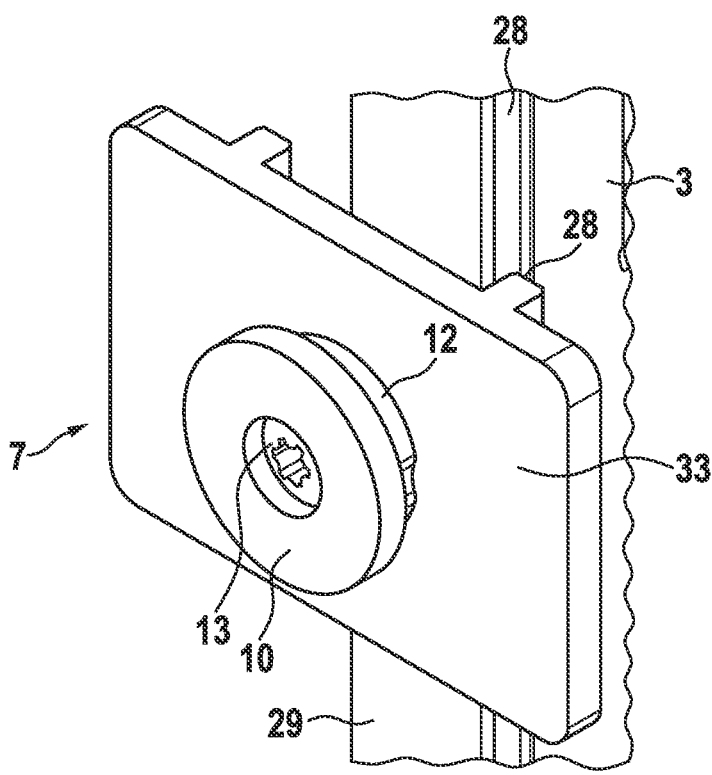
Figure 8:
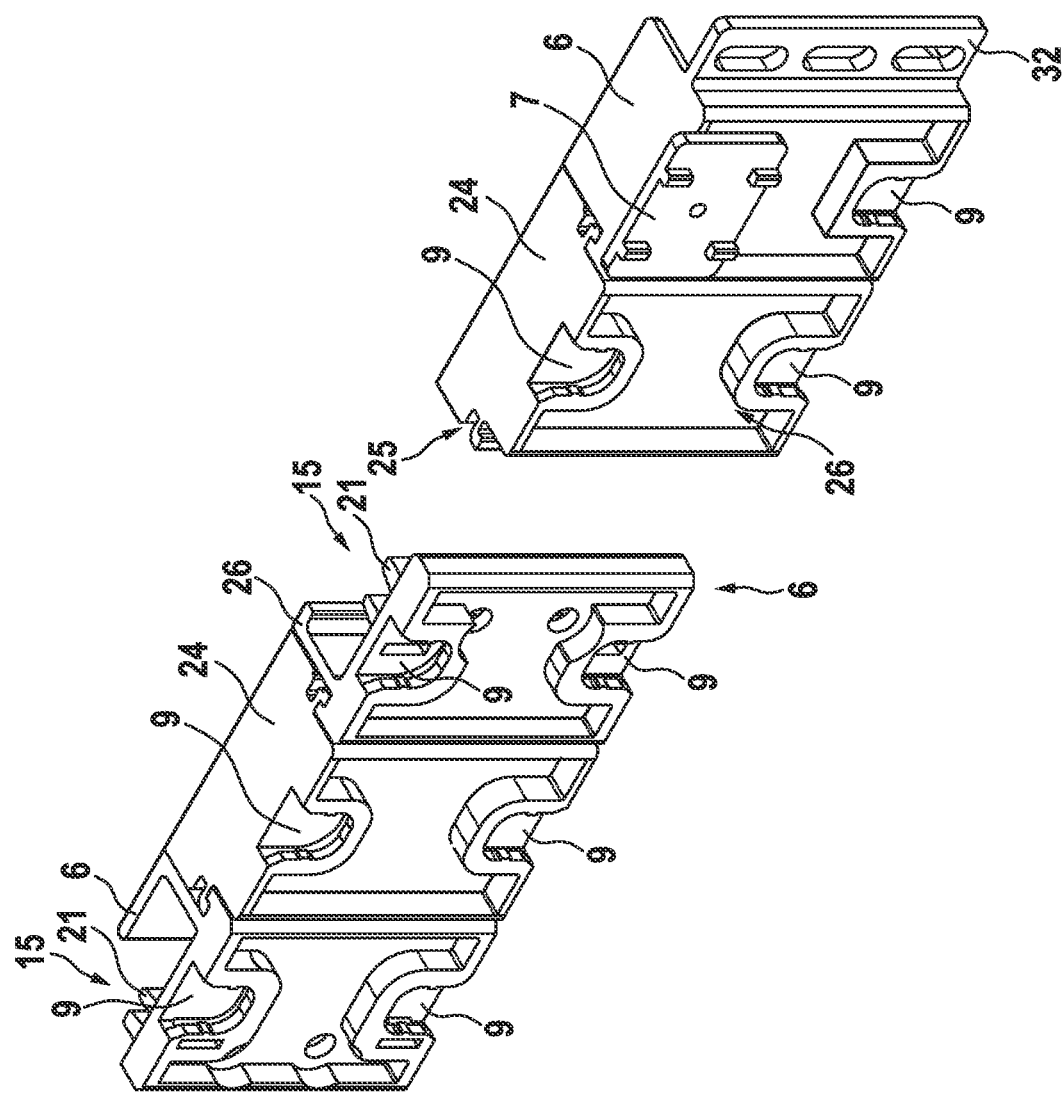
Figure 9:
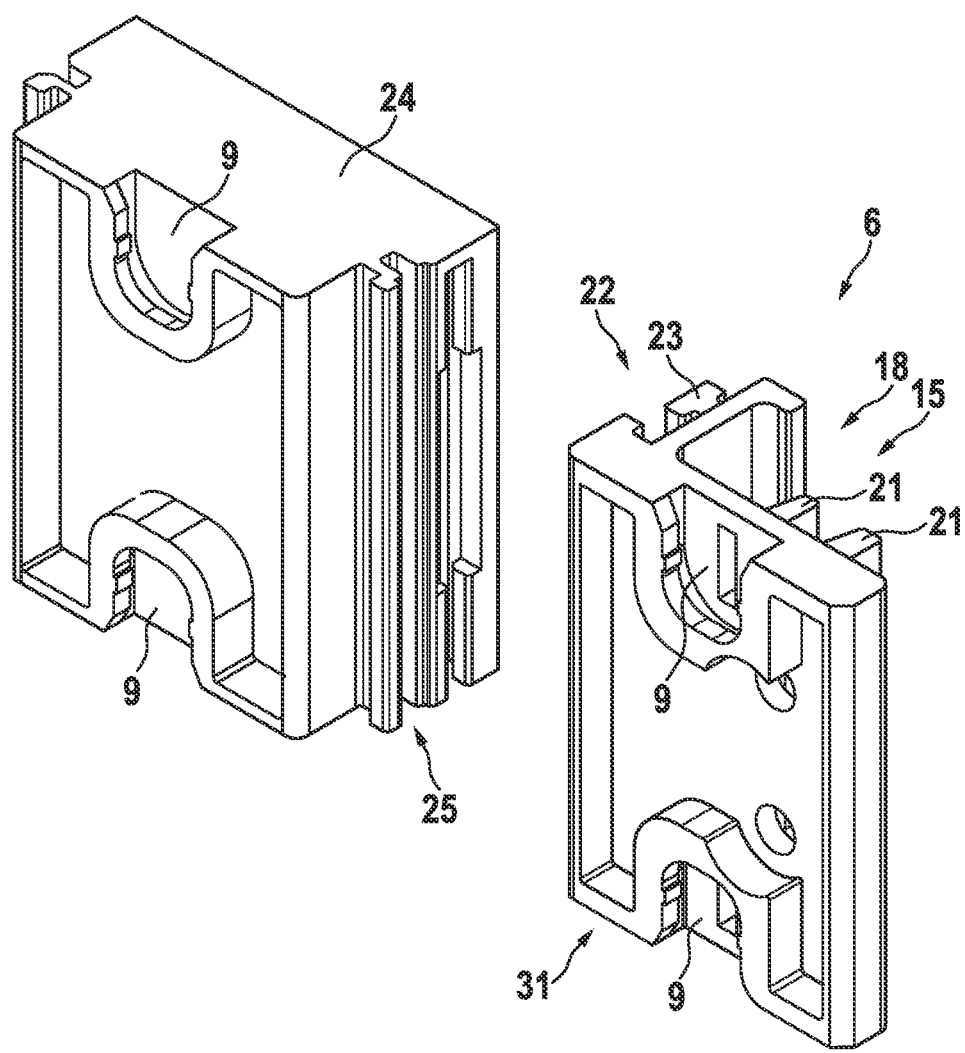

Further details of the invention are explained with reference to the figures below. Therein shows:

FIG. 1 a perspective view of a first embodiment of a switch cabinet arrangement according to the invention;

FIG. 2 a perspective view of a second embodiment of a switch cabinet arrangement according to the invention;

FIG. 3 an embodiment of an arrangement comprising a power strip and a first and a second adapter part;

FIG. 4 the embodiment according to FIG. 3 with a view of the rear side of the power strip;

FIG. 5 a further embodiment of a switch cabinet arrangement according to the invention in perspective view;

FIG. 6 a detailed view of a first adapter part according to one embodiment of the invention;

FIG. 7, a perspective view of an exemplary embodiment of a second adapter part;

FIG. 8 a perspective view of two arrangements of several second adapter parts arranged in a row; and FIG. 9 two further embodiments of a first adapter part and an extension adapter.

DETAILED DESCRIPTION

Example embodiments will now be described more fully with reference to the accompanying drawings.

FIG. 1 shows an exemplary embodiment of a switchgear cabinet arrangement 1 with a switchgear cabinet 2 and a power strip 3, which is mounted on a vertical profile 5 of the switchgear cabinet 2 via a suspension adapter 4. The vertical profile 5 is designed as a 19" installation rail, as they are installed in IT racks in the frame of the switch cabinet 2, in order to provide the 19" installation dimension customary in the IT sector. The vertical profile 5 is fixed via its opposite longitudinal ends to a horizontal profile of the frame of the enclosure 2.

The vertical profile 5 has a contour 19 within which a power strip can be mounted in a space-saving manner with the aid of the switch cabinet arrangement 1 according to the invention. For this purpose, the adapter 4 has a first adapter part 6, which is mounted in the contour 19, and a second adapter part 7, which is fixed to a rear side 29 via a tongue-and-groove connection 28.

The first adapter part 6 also has a baying interface 23, via which an extension adapter 24 with a complementary interface is attached. Analogous to the first adapter part 6, the extension adapter 24 also has an interface on its side facing the power strips 3 in the form of plug-in receptacles 9, via which the power strips 3 can be plugged into the first adapter part 6 or the extension adapter 24. On its side facing away from the first adapter part 6, the extension adapter 24 has a further complementary baying interface 25 for baying either a further extension adapter 24 or for baying a first adapter part 6. The extension adapter 24 can thus be symmetrical in a direction perpendicular to the longitudinal direction of the power strips 3.

The second adapter parts 7 have a mushroom head 10 (not visible) by means of which they are hooked into the respective plug-in receptacle 9 of the first adapter part 6 or of the extension adapter 24 in the vertical direction from above. The plug-in receptacles 9 can be designed as snap-in receptacles so that the power strips 3 are not only held in the plug-in receptacles 9 due to their own weight but are also secured against unintentional falling out of the plug-in receptacles. The plug-in receptacles 9 have a stop for the mushroom head 10 at the end in the direction of insertion, via which a defined end position of the mushroom head 10 in the plug-in receptacles 9 is achieved in the vertical downward direction.

To simplify the illustration, the power strips 3 are shown as U-shaped housings in all figures.

FIG. 2 shows a variation of the embodiment according to FIG. 1, which differs in particular in that the two power strips 3 are fixed directly to the frame of the switch cabinet 2, i.e. to a vertical profile of the frame 2. While the extension adapter 24 can be basically identical to the extension adapter 24 shown in FIG. 1, the first adapter part 6 is designed for mounting on the vertical profile of the frame 2. For this purpose, the first adapter part 6 may, for example, have the geometry as shown in FIG. 8, bottom right. In particular, the first adapter part 6 can have a fastening flange 32 via which the first adapter part 6 can be screwed to the vertical profile via the system perforation of the vertical profile of the enclosure.

FIG. 3 shows an exploded view of the interaction of a power strip 3 with a first and a second adapter part 6, 7. The second adapter part 7 is screwed to the rear side of the power strip 3 facing the first adapter part 6 by means of a detachable connection 8, which in this case is a screw connection with the aid of a screw bolt 13. On the rear side 29, the power strip 3 also has two longitudinal grooves 28 extending in the longitudinal direction and over the entire length of the socket housing shown, via which a tongue-and-groove connection is formed in cooperation with corresponding bearing projections on the side of the second adapter part 7 facing the rear side 29.

Referring back to FIG. 7, it can be seen that the second adapter part can have a mushroom head 10 which extends from the second adapter part 7 via a shank 12 on a side of the second adapter part facing away from the rear 29 of the power strip 3, the mushroom head 10 having a central through-hole via which the screw bolt 13 can be screwed through the mushroom head 10 and the shank 12 into the rear 29 of the power strip 3.

Referring back to FIG. 3, it can be seen that the first adapter part 6 has, on its front side 31 facing the rear side 29 and opposite in the longitudinal direction of the socket outlet strip 3, a respective plug-in receptacle 9 which is in the form of a snap-in receptacle and is open towards one of two opposite upper sides 30 of the first adapter part 6 and towards a front side 31 of the first adapter part 6 facing the second adapter part 7. In the direction perpendicular to the front side 31, the plug-in receptacle 9 is further undercut in order to hold the mushroom head 10 (cf. FIG. 7) in the plug-in receptacle 9.

The combination of FIGS. 6 and 7 further illustrates that when the mushroom head 10 with the shaft 12 is inserted into the plug-in receptacle 9, complementary latching means 33 engage with each other in the plug-in receptacle 9 or on the outer circumference of the shaft 12, respectively, and thus a locking of the second adapter part 7 in the latching receptacle 9 of the first adapter part is achieved.

The first adapter part 6 also has a baying interface 23 on an end face 22 perpendicular to the fastening side 15. Via the baying interface 23, the baying adapter 24 (cf. FIG. 1) can be fixed with an interface 25 complementary to the baying interface 23.

In the illustration according to FIG. 4, the arrangement according to FIG. 3 is shown looking at the fastening side 15 of the first adapter part 6. The fastening side 15 faces the vertical profile 5 (cf. FIG. 1) and has a shaped and/or locking piece 16 which, in the present embodiment, is composed of a shaped piece 18 and locking projections 21. The shaped piece 18 is designed to complement a contour 19 (cf. FIG. 1) of the vertical profile 5, at least in sections, so that a positive fit of the first adapter part 6 can be achieved at least in sections via the shaped piece 18 on the vertical profile 5. Furthermore, latching means 21 extend from the shaped piece 18, which are designed to engage in a system perforation 17 (see FIG. 1) of the vertical profile 5 and to engage behind it, so that a force-fit connection of the first adapter part 6 to the vertical profile 5 can also be achieved.

FIG. 5 shows a further embodiment of the invention in which the first of adapter part is formed in the form of keyhole-shaped cutouts 34 in a mounting side 14 of the vertical profile 5. Accordingly, the keyhole-shape cut outs 34 form plug-in receptacles via which a power strip 3, which has a second adapter part 7 on its rear side 29, can be hooked directly into the vertical profile 5. In principle, it can be envisaged that the embodiments shown in FIGS. 1 to 4 are compatible with the embodiment shown in FIG. 5, at least to the extent that the second adapter parts 7 shown in the different embodiments can be designed identically. This provides a highly flexible mounting option for the power strips inside the control cabinet 2.

FIG. 8 shows various baying combinations of first adapter parts 6 and extension adapters 24. In the embodiment shown above on the left, two first adapter parts 6 are connected to each other via an extension adapter 24. Both the two first adapter parts 6 and the extension adapter 24 have plug-in receptacles 9, so that the arrangement of two first adapter parts 6 and an extension adapter 24 shown in FIG. 8, top left, is set up for the suspended mounting of two power strips arranged next to each other. Furthermore, this arrangement is symmetrical in that, on the one hand, the arrangement of two first adapter parts 6 and an extension adapter 24 can be mounted on a vertical profile via either of the two first adapter parts 6, for example on a left-hand 19" vertical profile in the switch cabinet or on a right-hand vertical profile of the frame of a switch cabinet. Furthermore, the arrangement is symmetrical in that the individual components 6, 24 each have a plug-in receptacle 9 on opposite sides, so that the arrangement can also be mounted in a position rotated by 180° on either a left-hand or a right-hand vertical profile, and in each case provides the functionality according to the invention.

In the embodiment shown in the bottom right-hand corner of FIG. 8, the first adapter part 6 is designed to be fixed via its mounting flange 32 to a vertical profile of a switch cabinet frame via its system perforation.

Further details of the first adapter part 6 and the extension adapter 24 are shown in FIG. 9. The view according to FIG. 9 shows in particular that one embodiment of the first adapter part 6 can have three functional sides. Plug-in receptacles 9 are formed on the front side 31, which can be arranged facing a second adapter part. In addition, the first adapter part 6 has, on its fastening side 15 opposite the front side 31, a shaped piece 18 and latching projections 21 for fixing the first adapter part 6 to a vertical profile, for example to a 19" mounting rail. Perpendicular to the front side 31 and the fastening side 15 is the front side 22 of the first adapter part 6, on which the first adapter part 6 has a baying interface 23 for baying an extension adapter 24. Accordingly, the extension adapter 24 has a complementary interface 25 facing the end face 22.

The features of the invention disclosed in the foregoing description, in the drawings as well as in the claims may be essential for the realisation of the invention both individually and in any combination.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A switch cabinet arrangement comprising at least one switch cabinet and at least one power strip, wherein the at least one power strip is fixed to a vertical profile inside the at least one switch cabinet by a hook-in adapter, the hook-in adapter having a first adapter part and a second adapter part, the first adapter part has at least one shaped and/or latching piece on a fastening side of the first adapter part, the at least one shaped and/or latching piece for fixedly mounting the first adapter part in a system perforation of the vertical profile in a form-fitting and/or force-fitting manner, the second adapter part being hooked into the first adapter part, and the second adapter part being fixed to the at least one power strip.

2. The switch cabinet arrangement according to claim 1, in which the second adapter part is fixed to the at least one power strip via a detachable connection.

3. The switch cabinet arrangement according to claim 2, in which the detachable connection is via a screw connection.

4. The switch cabinet arrangement according to claim 1, in which the first adapter part has a plug-in receptacle, and the second adapter part has a mushroom head which is hooked into the plug-in receptacle.

5. The switch cabinet arrangement according to claim 4, in which the second adapter part has a contact side facing away from the at least one power strip, via which the second adapter part rests against the first adapter part or against the vertical profile, the mushroom head projecting from the contact side by means of a shank which is locked in the plug-in receptacle via a latching connection.

6. The switch cabinet arrangement according to claim 4, in which the second adapter part is fastened to a rear side of the at least one power strip via a screw bolt, the screw bolt extending, starting from the mushroom head, through the mushroom head and the shaft into the rear side of the at least one power strip.

7. The switch cabinet arrangement according to claim 4, in which the plug-in receptacle is a snap-in receptacle or a keyhole.

8. The switch cabinet arrangement according to claim 1, wherein the vertical profile is a profile rail, which is fixed via its opposite longitudinal ends within the at least one switch cabinet, wherein the first adapter part is a keyhole of a plurality of keyholes which are formed regularly spaced in a mounting side of the profile rail.

9. The switch cabinet arrangement according to claim 8, wherein the profile rail is a 19" profile rail.

10. The switch cabinet arrangement according to claim 1, in which the at least one shaped and/or latching piece has a shaped piece which bears in the form-fitting manner and/or force-fitting manner against a contour of the vertical profile of a framework of the at least one switch cabinet, at least one latching projection extends from the shaped piece via which the at least one shaped and/or latching piece engages in the system perforation of the vertical profile and engages behind the vertical profile.

11. The switch cabinet arrangement according claim 1, in which the first adapter part has a plug-in receptacle for the second adapter part on an opposite side of the at least one shaped and/or latching piece.

12. The switch cabinet arrangement according to claim 1, in which the first adapter part has a baying interface on an end face perpendicular to the fastening side.

13. The switch cabinet arrangement according to claim 12, in which an extension adapter having an interface complementary to the baying interface is fixed via the baying interface, the extension adapter having a third adapter part via which a further power strip of the at least one power strip is fixed via a fourth adapter part.

14. The switch cabinet arrangement according to claim 13, in which the third adapter part is identical to the first adapter part and the fourth adapter part is identical to the second adapter part.

15. The switch cabinet arrangement according to claim 13, in which the first adapter part and the third adapter part each have a plug-in receptacle and preferably the same plug-in receptacle, the two plug-in receptacle of the first adapter part and the plug-in receptacle of the third adapter part being arranged in the same plane.

16. The switch cabinet arrangement according to claim 15, in which the plug-in receptacle of the first adapter part is identical to the plug-in receptacle of the third adapter part.

17. The switch cabinet arrangement according to claim 1, in which the second adapter part is connected to a rear side of the at least one power strip facing away from sockets of the at least one power strip via a tongue-and-groove connection extending in a longitudinal direction of the at least one power strip.

18. The switchgear cabinet arrangement according to claim 1, in which the first adapter part has a plug receptacle, which is open towards an upper side of the first adapter part and towards a front side of the first adapter part facing the second adapter part and is designed so as to be undercut only in a direction perpendicular to the front side.

19. The switchgear cabinet arrangement according to claim 18, in which the plug receptacle is a latching receptacle.

\* \* \* \* \*